US011569487B2

(12) United States Patent
Hong et al.

(10) Patent No.: US 11,569,487 B2
(45) Date of Patent: Jan. 31, 2023

(54) MASK ASSEMBLY, APPARATUS AND METHOD OF MANUFACTURING DISPLAY DEVICE USING THE SAME, AND DISPLAY DEVICE

(71) Applicant: Samsung Display Co., Ltd., Yongin-Si (KR)

(72) Inventors: Jaemin Hong, Yongin-si (KR); Hanul Kwen, Yongin-si (KR); Jeunghoon Kim, Yongin-si (KR); Jakyung Yu, Yongin-si (KR); Sujin Lee, Yongin-si (KR)

(73) Assignee: Samsung Display Co., Ltd.

( * ) Notice: Subject to any disclaimer, the term of this patent is extended or adjusted under 35 U.S.C. 154(b) by 17 days.

(21) Appl. No.: 17/063,676

(22) Filed: Oct. 5, 2020

(65) Prior Publication Data

US 2021/0020874 A1    Jan. 21, 2021

Related U.S. Application Data

(62) Division of application No. 15/651,808, filed on Jul. 17, 2017, now Pat. No. 10,818,877.

(30) Foreign Application Priority Data

Aug. 8, 2016    (KR) .................. 10-2016-0100880

(51) Int. Cl.
*H01L 51/56* (2006.01)
*C23C 14/04* (2006.01)
(Continued)

(52) U.S. Cl.
CPC ............ *H01L 51/56* (2013.01); *C23C 14/042* (2013.01); *H01L 27/326* (2013.01);
(Continued)

(58) Field of Classification Search
None
See application file for complete search history.

(56) References Cited

U.S. PATENT DOCUMENTS 6,221,563 B1    4/2001    Hryhorenko et al.
7,704,326 B2    4/2010    Hagiwara et al.
(Continued)

FOREIGN PATENT DOCUMENTS

CN    102766841 A    11/2012
CN    104726821 A    6/2015
(Continued)

OTHER PUBLICATIONS

Chinese Office Action Report, Application No. 201710659182.7 dated Oct. 26, 2020, 12 pages.
(Continued)

*Primary Examiner* — Khaja Ahmad
(74) *Attorney, Agent, or Firm* — Innovation Counsel LLP

(57) ABSTRACT

Provided are a display device, a mask assembly, and an apparatus and a method for manufacturing the display device. The mask assembly includes: a mask frame; at least two mask sheets installed on the mask frame, each of the mask sheets including a plurality of openings; and at least two thin shielding plates installed on the mask frame such that the thin shielding plates are spaced apart from each other and shield a portion of the plurality of openings of each mask sheet, wherein one of the mask sheets and the thin shielding plates includes a shielding portion between the thin shielding plates spaced apart from each other, the shielding portion selectively blocking at least portions of the openings so as to form a deposition region having a shape other than a rectangle or a square.

15 Claims, 13 Drawing Sheets

(51) Int. Cl.
*H01L 27/32* (2006.01)
*H01L 51/00* (2006.01)

(52) U.S. Cl.
CPC ...... *H01L 27/3223* (2013.01); *H01L 27/3244* (2013.01); *H01L 51/0011* (2013.01); *H01L 27/3246* (2013.01); *H01L 2227/323* (2013.01)

(56) References Cited

U.S. PATENT DOCUMENTS

| | | | |
|---|---|---|---|
| 10,344,376 B2 | 7/2019 | Hong | |
| 2005/0214577 A1 | 9/2005 | Sakamoto et al. | |
| 2006/0246619 A1 | 11/2006 | Imamura | |
| 2008/0118743 A1* | 5/2008 | Lee | C23C 14/042 428/332 |
| 2009/0130788 A1 | 5/2009 | Koo et al. | |
| 2009/0218569 A1 | 9/2009 | Fujikawa | |
| 2010/0193791 A1 | 8/2010 | Chun | |
| 2012/0156812 A1 | 6/2012 | Ko et al. | |
| 2012/0279444 A1* | 11/2012 | Hong | C23C 14/042 118/504 |
| 2012/0299016 A1* | 11/2012 | Choi | C23C 14/50 438/46 |
| 2013/0214388 A1 | 8/2013 | Subramanian | |
| 2013/0239891 A1* | 9/2013 | Sonoda | H01L 31/18 118/715 |
| 2013/0240870 A1* | 9/2013 | Kawato | C23C 14/042 438/46 |
| 2014/0306198 A1 | 10/2014 | Im et al. | |
| 2014/0320543 A1 | 10/2014 | Oh et al. | |
| 2014/0332763 A1 | 11/2014 | Kim | |
| 2015/0001485 A1* | 1/2015 | Kang | H01L 51/0005 257/40 |
| 2015/0011033 A1* | 1/2015 | Ko | B05C 21/005 438/34 |
| 2015/0037928 A1* | 2/2015 | Hirobe | B05B 12/20 438/99 |
| 2015/0060823 A1* | 3/2015 | Furuie | H01L 27/3223 257/40 |
| 2015/0116295 A1 | 4/2015 | Pyon | |
| 2015/0165464 A1 | 6/2015 | Baek | |
| 2015/0311265 A1* | 10/2015 | Matsueda | H01L 27/3211 257/89 |
| 2015/0357388 A1 | 12/2015 | Pang | |
| 2016/0005970 A1 | 1/2016 | Kwen et al. | |
| 2016/0035284 A1* | 2/2016 | Jung | H01L 27/3276 345/82 |
| 2017/0179390 A1 | 6/2017 | Baek | |
| 2017/0207390 A1 | 7/2017 | Kim et al. | |

FOREIGN PATENT DOCUMENTS

| | | |
|---|---|---|
| CN | 104846328 A | 8/2015 |
| JP | 2004-55231 A | 2/2004 |
| JP | 2004-296436 A | 10/2004 |
| KR | 10-2005-0053326 A | 6/2005 |
| KR | 10-2009-0059225 A | 6/2009 |
| KR | 10-2010-0101436 A | 9/2010 |
| KR | 10-2016-0005272 A | 1/2016 |
| KR | 10-2017-0075113 A | 7/2017 |

OTHER PUBLICATIONS

Partial European Search Report for application No. 17185095.1, dated Oct. 23, 2017.
Extended European Search Report, Application No. 17185095.1, dated Jan. 12, 2018, pp. 1-11.

* cited by examiner

MASK ASSEMBLY, APPARATUS AND METHOD OF MANUFACTURING DISPLAY DEVICE USING THE SAME, AND DISPLAY DEVICE

CROSS-REFERENCE TO RELATED APPLICATION

This application is a divisional application of U.S. patent application Ser. No. 15/651,808 filed on Jul. 17, 2017, which claims priority under 35 USC § 119 to Korean Patent Application No. 10-2016-0100880 filed on Aug. 8, 2016 in the Korean Intellectual Property Office, the disclosures of which are incorporated herein in their entirety by reference.

BACKGROUND

1. Field

One or more embodiments relate generally to display devices, and more particularly, to a mask assembly, a method and an apparatus for manufacturing a display device using the same, for a display device.

2. Description of the Related Art

Mobile electronic devices are now widely used. Examples of such mobile electronic devices are tablet personal computers (PCs), as well as miniaturized electronic devices such as mobile phones.

To support various functions, the mobile electronic apparatus includes a display device in order to provide visual information, such as an image, to a user. As parts that make up display devices have become miniaturized, the importance of display devices within electronic devices has gradually increased, leading to the development of structures for displays that may be bent from a flat state to have a predetermined angle.

SUMMARY

In the case where a mask assembly of the related art is used, a display area may be manufactured only in the shape of a rectangle or a square, and thus there may be difficulty in applying the display area to various products.

One or more embodiments include a mask assembly that may be used to manufacture display devices in various shapes, a method and an apparatus for manufacturing a display device, and the display device.

Additional aspects will be set forth in part in the description which follows and, in part, will be apparent from the description, or may be learned by practice of the presented embodiments.

According to one or more embodiments, a mask assembly includes: a mask frame; at least two mask sheets installed on the mask frame, each of the mask sheets including a plurality of openings; and at least two thin shielding plates installed on the mask frame such that the thin shielding plates are spaced apart from each other and shield a portion of the plurality of openings of each mask sheet, wherein one of the mask sheets and the thin shielding plates includes a shielding portion between the thin shielding plates spaced apart from each other, the shielding portion selectively blocking at least portions of the openings so as to form a deposition region having a shape other than a rectangle or a square.

The shielding portion may include a first shielding portion including a portion of the thin shielding plate and protruding to the deposition region.

The shielding portion may include a second shielding portion shielding a portion of the plurality of openings in the deposition region, the mask sheet comprising the second shielding portion.

The shielding portion may include: a first shielding portion including a portion of the thin shielding plate and protruding to the deposition region; and a second shielding portion shielding a portion of the plurality of openings in the deposition region, the mask sheet comprising the second shielding portion.

The first shielding portion may at least partially overlap the second shielding portion.

At least a portion of the second shielding portion may have a thickness less than that of the mask sheet.

The shielding portion may shield at least a portion of at least one opening at a boundary of the deposition region.

The mask sheet may comprise a first material and the thin shielding plate may comprise a second material different from the first material.

According to one or more embodiments, an apparatus for manufacturing a display device includes: a mask assembly; a source unit facing the mask assembly and configured to supply a deposition material; and a magnetic field generating unit configured to direct the mask assembly toward a display substrate. The mask assembly includes: a mask frame; at least two mask sheets installed on the mask frame, each of the mask sheets including a plurality of openings; and at least two thin shielding plates installed on the mask frame such that the thin shielding plates are spaced apart from each other and shield a portion of the plurality of openings of each mask sheet, wherein one of the mask sheets and the thin shielding plates includes a shielding portion between the thin shielding plates spaced apart from each other, the shielding portion selectively blocking at least portions of the openings so as to form a deposition region having a shape other than a rectangle or a square.

The shielding portion may include a first shielding portion including a portion of the thin shielding plate and protruding to the deposition region.

The shielding portion may include a second shielding portion provided in the mask sheet and shielding a portion of the plurality of openings in the deposition region. The mask sheet may comprise the second shielding portion.

The shielding portion may include: a first shielding portion including a portion of the thin shielding plate and protruding to the deposition region; and a second shielding portion shielding a portion of the plurality of openings in the deposition region. The mask sheet may comprise the second shielding portion.

The first shielding portion may at least partially overlap the second shielding portion.

At least a portion of the second shielding portion may have a thickness less than that of the mask sheet.

The mask sheet may comprise a first material and the thin shielding plate may comprise a second material different from the first material.

According to one or more embodiments, a method of manufacturing a display device includes: arranging a mask assembly such that the mask assembly faces a display substrate; applying a force to the mask assembly and directed toward the display substrate by using a magnetic field generating unit; and emitting a deposition material from a source unit to allow the deposition material to pass through the mask assembly, and depositing the deposition material on the display substrate. The mask assembly includes: a mask frame; at least two mask sheets installed on the mask frame, each of the mask sheets including a plurality of openings; and at least two thin shielding plates installed on the mask frame such that the thin shielding plates are spaced apart from each other and shield a portion of the plurality of openings of each mask sheet, wherein one of the mask sheets and the thin shielding plates includes a shielding portion between the thin shielding plates spaced apart from each other, the shielding portion selectively blocking at least portions of the openings so as to form a deposition region having a shape other than a rectangle or a square.

The shielding portion may include a first shielding portion including a portion of the thin shielding plate and protruding to the deposition region.

The shielding portion may include a second shielding portion provided in the mask sheet and shielding a portion of the plurality of openings in the deposition region. The mask sheet may comprise the second shielding portion.

The shielding portion may include: a first shielding portion including a portion of the thin shielding plate and protruding to the deposition region; and a second shielding portion provided in the mask sheet and shielding a portion of the plurality of openings in the deposition region. The mask sheet may comprise the second shielding portion.

The first shielding portion may at least partially overlap the second shielding portion.

At least a portion of the second shielding portion may have a thickness less than that of the mask sheet.

The depositing the deposition material may further comprise depositing the deposition material on the display substrate in a vacuum.

The shielding portion may shield at least a portion of at least one opening at a boundary of the deposition region.

The depositing the deposition material may further comprise depositing the deposition material on a non-emission region of the display substrate.

The mask sheet may comprise a material different from that of the thin shielding plate.

According to one or more embodiments, a method of manufacturing a display device includes: arranging a mask assembly such that the mask assembly faces a display substrate; applying a force to the mask assembly and directed toward the display substrate, by using a magnetic field generating unit; and forming a dummy intermediate layer above a pixel-defining layer of the display substrate by emitting a deposition material from a source unit, allowing the deposition material to pass through the mask assembly, forming a plurality of intermediate layers over the display substrate, and forming a display area, wherein the display area includes a shape other than a rectangle or a square.

The intermediate layer may have an area different from that of the dummy intermediate layer.

The dummy intermediate layer may have an area less than that of the intermediate layer.

The intermediate layer and the dummy intermediate layer may include the same material.

The dummy intermediate layer may be arranged in a non-emission region.

According to one or more embodiments, a display device includes: a display substrate; a pixel-defining layer over the display substrate, a portion of the pixel-defining layer being open; an intermediate layer at the open portion of the pixel-defining layer; and a dummy intermediate layer above the pixel-defining layer.

The intermediate layer may have an area different from that of the dummy intermediate layer.

The dummy intermediate layer may have an area less than that of the intermediate layer.

The dummy intermediate layer may be arranged in a non-emission region.

The intermediate layer and the dummy intermediate layer may include the same material.

The intermediate layer and the dummy intermediate layer may respectively comprise a plurality of intermediate layers and a plurality of dummy intermediate layers, the plurality of dummy intermediate layers being arranged outside the plurality of intermediate layers.

The intermediate layer may comprise a plurality of intermediate layers spaced apart from each other and may form a display area having a shape other than a rectangle or a square.

This general and specific aspect may be embodied by using a system, a method, and a computer program, or a combination of a certain system, a method, and a computer program.

Embodiments may deposit a shape which is not a rectangle or a square. Also, embodiments may improve deposition efficiency and deposition accuracy by making a more uniform interval between a display substrate and a mask sheet.

Embodiments may minimize a deposition defect occurring during deposition.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
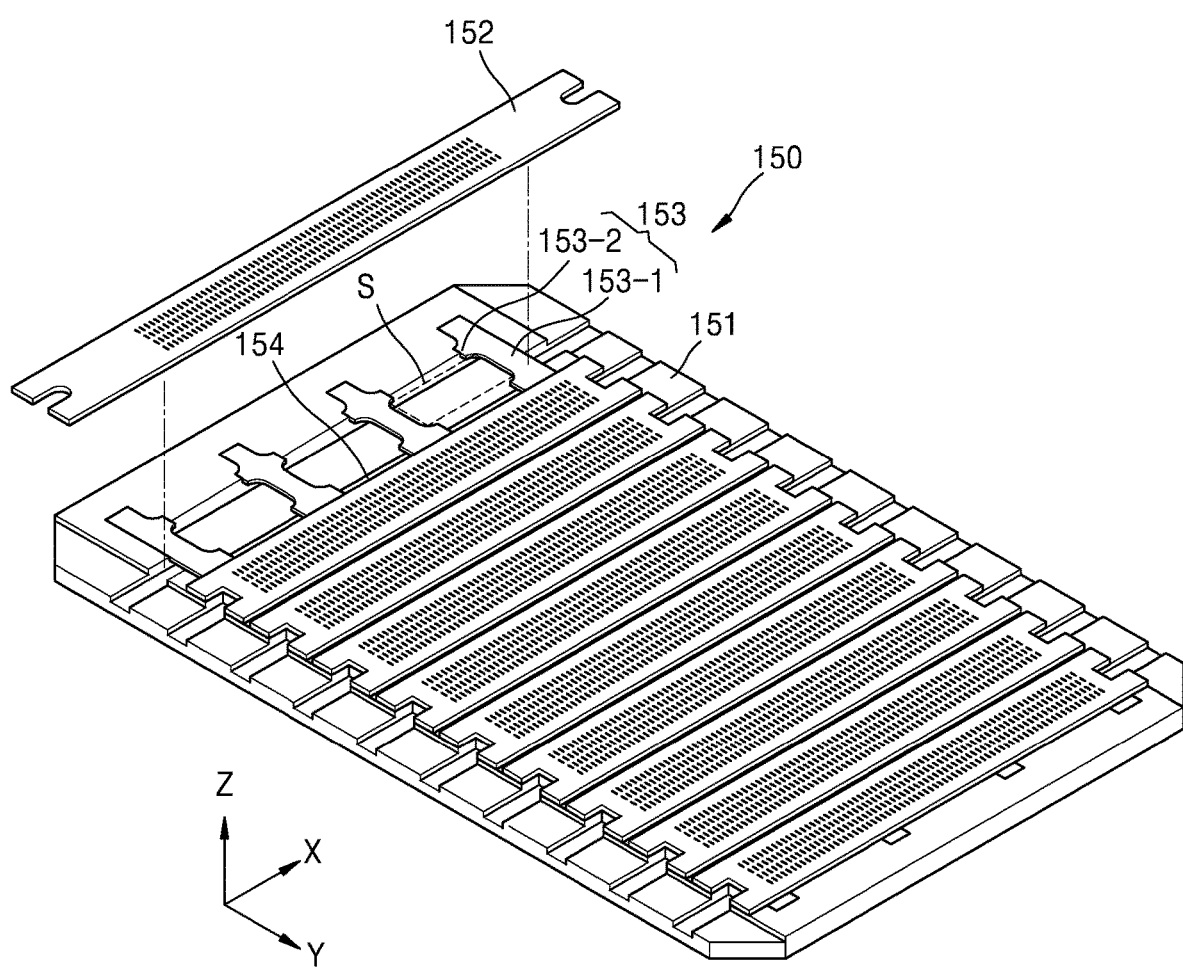
FIG. 1 is a perspective view of a mask assembly according to an embodiment.

As the inventive concept allows for various changes and numerous embodiments, exemplary embodiments will be illustrated in the drawings and described in detail in the written description. An effect and a characteristic of the inventive concept, and a method of accomplishing these will be apparent when referring to embodiments described with reference to the drawings. This inventive concept may, however, be embodied in many different forms and should not be construed as limited to the exemplary embodiments set forth herein.

Hereinafter, the inventive concept will be described more fully with reference to the accompanying drawings, in which exemplary embodiments of the inventive concept are shown. When description is made with reference to the drawings, like reference numerals in the drawings denote like or corresponding elements, and repeated description thereof will be omitted.

As used herein, the term "and/or" includes any and all combinations of one or more of the associated listed items.

It will be understood that although the terms "first", "second", etc. may be used herein to describe various components, these components should not be limited by these terms. These components are only used to distinguish one component from another.

As used herein, the singular forms "a" "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto. The various figures thus may not be to scale.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order. All numerical values are approximate, and may vary. All examples of specific materials and compositions are to be taken as nonlimiting and exemplary only. Other suitable materials and compositions may be used instead.

Figure 2:
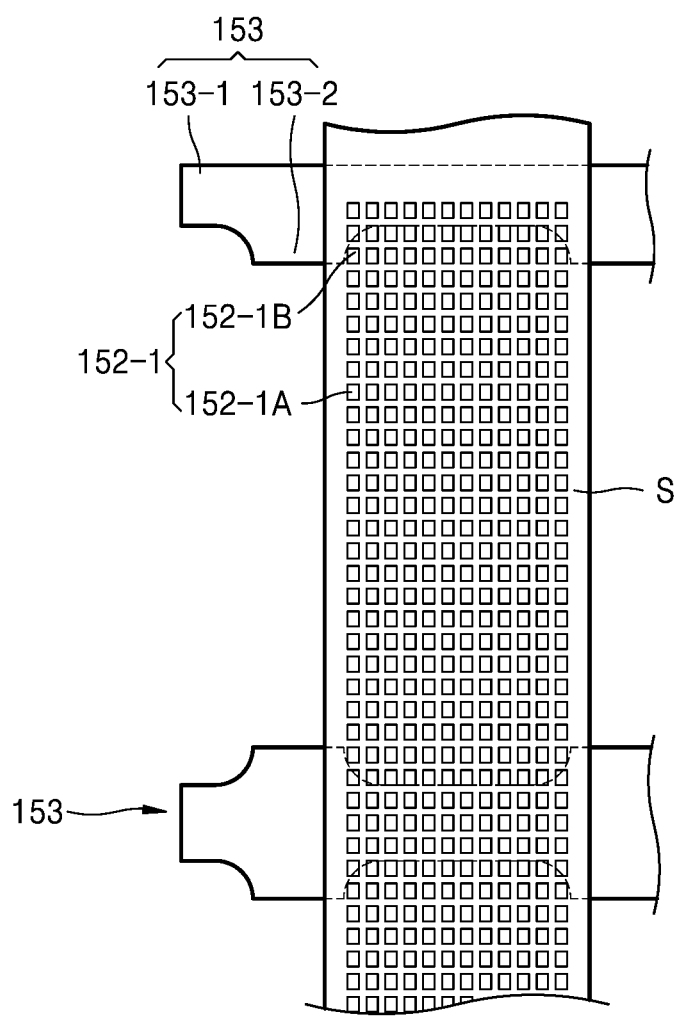
FIG. 2 is a plan view of a mask sheet and a thin shielding plate included in the mask assembly illustrated in FIG. 1.
Figure 3:
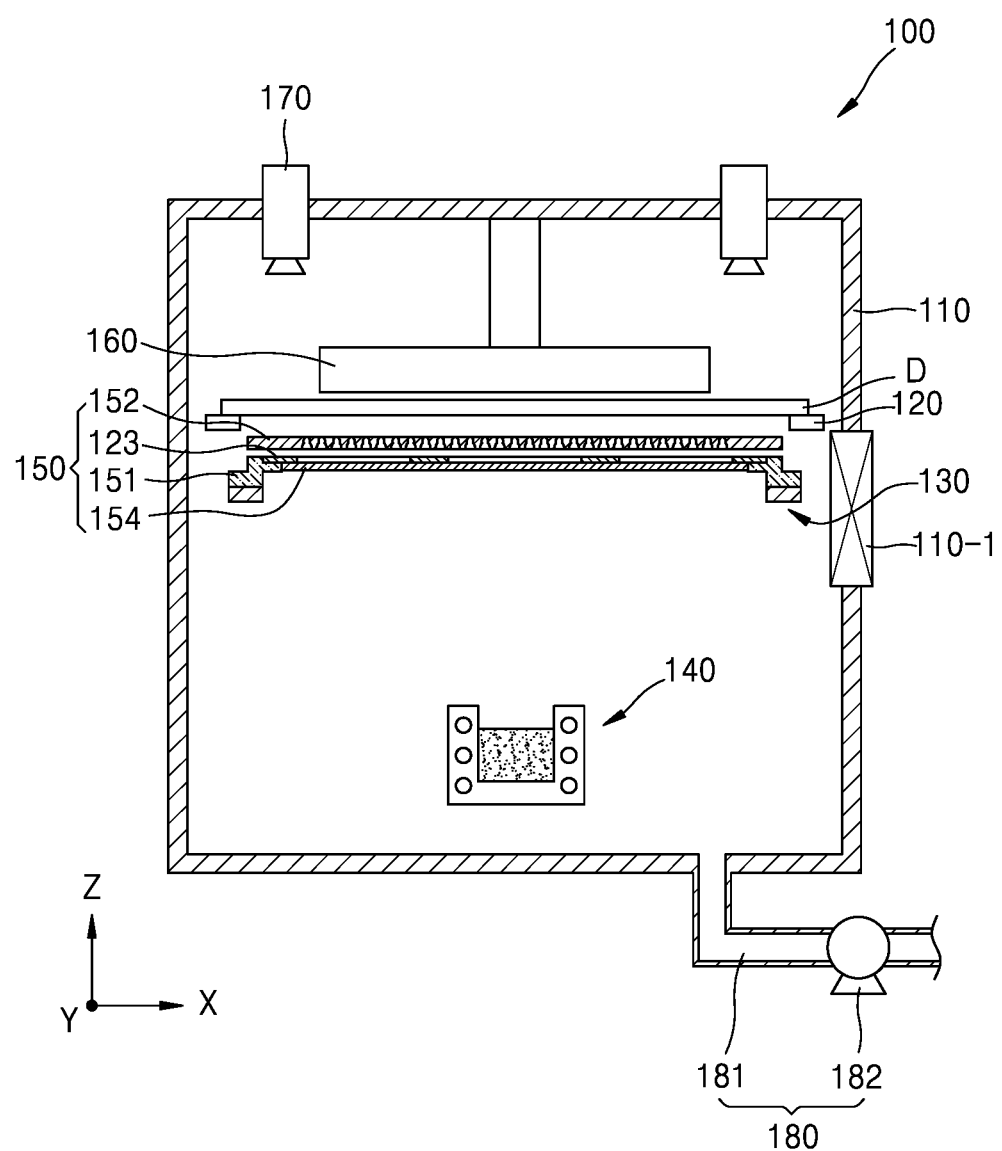
FIG. 3 is a cross-sectional view of an apparatus for manufacturing a display device including the mask assembly illustrated in FIG. 1.

FIG. 1 is a perspective view of a mask assembly 150 according to an embodiment. FIG. 2 is a plan view of a mask sheet and a thin shielding plate of the mask assembly illustrated in FIG. 1. FIG. 3 is a cross-sectional view of an apparatus 100 for manufacturing a display device including the mask assembly illustrated in FIG. 1.

Referring to FIGS. 1 to 3, the mask assembly 150 may include mask frames 151, a mask sheet 152, a thin shielding plate 153, and a support frame 154.

In the mask assembly 150, the plurality of frames 151 may be connected to each other such that spaces are formed therebetween.

At least two mask sheets 152 may be provided and installed on the mask frames 151 such that the mask sheets 152 are spaced apart from each other. In this case, the mask sheets 152 may be arranged sequentially along a first direction (e.g. Y-axis direction of FIG. 1).

A plurality of openings 152-1 may be arranged in the mask sheet 152 in a lengthwise direction. In this case, the plurality of openings 152-1 may be spaced apart from each other by a predetermined interval and may substantially occupy an entire surface of the mask sheet 152.

The plurality of openings 152-1 may include first openings 152-1A inside a deposition region S, and second openings 152-1B at an edge of the deposition region S.

The thin shielding plate 153 may be installed on the mask frame 151. In this case, the thin shielding plate 153 may be a plurality of thin shielding plates, which may be installed on the mask frame 151 such that the thin shielding plates 153 are spaced apart from each other. The deposition region S may be defined by an area between the thin shielding plates 153. Particularly, the deposition region S may have a shape other than a rectangle or a square. For example, the shape of the deposition region S in plan view may be a triangle, a polygon, an ellipse, or a circle.

The thin shielding plate 153 may include a thin shielding plate body portion 153-1 installed on the mask frame 151, and a first shielding portion 153-2 protruding from the thin shielding plate body portion 153-1.

The thin shielding plate body portion 153-1 may include a straight line-shaped or linear plate. In this case, the thin shielding plate body portion 153-1 may be arranged in a direction (or a first direction) perpendicular to a lengthwise direction of the mask sheet 152, e.g. to extend along the Y-axis direction of FIG. 1.

The first shielding portion 153-2 may protrude in a lengthwise direction of the mask sheet 152 from the thin shielding plate body portion 153-1. In this case, the first shielding portion 153-2 may define an edge of the shape of the deposition region S with the thin shielding plate body portion 153-1. Particularly, the first shielding portion 153-2 may define a portion of the edge of the deposition region S, and may form a predetermined angle with the thin shielding plate body portion 153-1, a curved portion, etc.

The first shielding portion 153-2 may shield a portion of the plurality of openings 152-1 in the deposition region S. For example, the first shielding portion 153-2 may shield a portion of the second openings 152-1B near the edge (or the boundary) of the deposition region S. In this case, a deposition material may pass through only a portion of the second openings 152-1B.

The thin shielding plate 153 and the mask sheet 152 may include materials different from each other. For example, the thin shielding plate 153 may include austenitic stainless steels, and the mask sheet 152 may include a nickel-steel alloy (Invar).

The thin shielding plate 153 and the mask sheet 152 may be fixed to the mask frame 151 while the thin shielding plate 153 and the mask sheet 152 are extended. In this case, the thin shielding plate 153 and the mask sheet 152 may be fixed to the mask frame 151 via welding.

A support frame 154 may be between adjacent mask sheets 152. Both ends of the support frame 154 may be inserted into the mask frame 151. In this case, the support frame 154 may shield an interval between the mask sheets 152 and may also support the mask sheets 152, thereby preventing sagging of the mask sheets 152.

An apparatus 100 for manufacturing a display device may include a chamber 110, a first support 120, a second support 130, the mask assembly 150, a source unit 140, a magnetic field generating unit 160, a vision unit 170, and a pressure adjustor 180.

The chamber 110 may include a space therein, and the chamber 110 may have an opening. In this case, a gate valve 110-1 may be installed on the opening of the chamber 110 and the chamber 110 may be opened or closed by an operation of the gate valve 110-1.

The first support 120 may seat a display substrate D thereon and support the display substrate D. In this case, the first support 120 may have a bracket form and be fixed inside the chamber 110. In another embodiment, the first support 120 may have a shuttle form which may seat the display substrate D thereon, and may move linearly inside the chamber 110. Hereinafter, for convenience of description, a case of the first support 120 having a bracket form and being fixed inside the chamber 110 is mainly described.

The second support 130 may seat the mask assembly 150 thereon. In this case, the second support 130 may be inside the chamber 110. The second support 130 may fine-adjust the location of the mask assembly 150. In this case, the second support 130 may include a separate driver or alignment unit, etc. for moving the mask assembly 150 in different directions.

The source unit 140 may face the mask assembly 150. In this case, the source unit 140 may receive a deposition material and evaporate or sublimate the deposition material by applying heat to the deposition material.

The magnetic field generating unit 160 may be inside the chamber 110 and may face the display substrate D. In this case, the magnetic field generating unit 160 may apply force to the mask assembly 150 through the display substrate D by applying magnetic force to the mask sheet 152. Particularly, the magnetic field generating unit 160 may not only prevent sagging of the mask sheet 152 but may also allow the mask sheet 152 to approach the display substrate D. Also, the magnetic field generating unit 160 may maintain a uniform interval between the mask sheet 152 and the display substrate D with respect to the lengthwise direction of the mask sheet 152.

The vision unit 170 may be installed on the chamber 110 and may capture locations of the display substrate D and the mask assembly 150. In this case, the vision unit 170 may include a camera capturing the display substrate D and the mask assembly 150. The locations of the display substrate D and the mask assembly 150 may be recognized based on an image captured by the vision unit 170. The second support 130 may then fine-adjust the location of the mask assembly 150 based on the image.

The pressure adjuster 180 may be connected to the chamber 110, and may adjust the pressure of the atmosphere inside of the chamber 110. For example, the pressure adjustor 180 may adjust the pressure of the inside of the chamber 110 to a pressure level the same as or similar to atmospheric pressure. Also, the pressure adjustor 180 may adjust the pressure of the inside of the chamber 110 to a level the same as or similar to that of a vacuum state.

The pressure adjustor 180 may include a connection pipe 181 connected to the chamber 110, and a pump 182 installed on the connection pipe 181. In this case, external air may be introduced via the connection pipe 181, or a gas inside the chamber 110 may be guided to the outside via the connection pipe 181 depending on an operation of the pump 182.

Meanwhile, the apparatus 100 for manufacturing the display device may be used to manufacture a display device (not shown) which will be described below. When the pressure adjustor 180 adjusts the pressure of the inside of the chamber 110 to a level the same as or similar to atmospheric pressure, the gate valve 110-1 may operate to open the chamber 110.

After that, the display substrate D may be inserted from the outside of the chamber 110 into the inside of the chamber 110. In this case, the display substrate D may be inserted into the chamber 110 by various methods. For example, the display substrate D may be inserted from the outside of the chamber 110 into the inside of the chamber 110 via a robot arm, etc. provided outside the chamber 110. In another embodiment, in the case where the first support 120 has a shuttle form, the first support 120 is carried out from the inside of the chamber 110 to the outside of the chamber 110, and then the display substrate D is seated above the first support 120 via a separate robot arm, etc. provided outside the chamber 110. Subsequently, the first support 120 is inserted from the outside of the chamber 110 into the inside of the chamber 110. Hereinafter, for convenience of description, a case where the display substrate D is inserted from the outside of the chamber 110 into the inside of the chamber 110 via a robot arm provided outside the chamber 110 is mainly described.

The mask assembly 150 may be inside the chamber 110 as described above. In another embodiment, like or similar to the display substrate D, the mask assembly 150 may be inserted from the outside of the chamber 110 into the inside of the chamber 110. However, hereinafter, for convenience of description, a case where only the display substrate D is inserted from the outside of the chamber 110 into the inside of the chamber 110 with the mask assembly 150 already inside the chamber 110 is mainly described.

When the display substrate D is inserted into the inside of the chamber 110, the display substrate D may be seated above the first support 120. In this case, the vision unit 170 may capture the locations of the display substrate D and the mask assembly 150. Particularly, the vision unit 170 may capture a first align mark of the display substrate D and a second align mark of the mask assembly 150.

The locations of the display substrate D and the mask assembly 150 may be recognized based on the captured first align mark and the captured second align mark. In this case, the apparatus 100 for manufacturing the display device may include a separate controller (not shown) and may recognize the locations of the display substrate D and the mask assembly 150.

When the locations of the display substrate D and the mask assembly 150 have been recognized, the second support 130 may fine-adjust the location of the mask assembly 150.

After that, the source unit 140 may operate and supply the deposition material to the mask assembly 150. The deposition material that has passed through the plurality of openings 152-1 may be deposited on the display substrate D. In this case, the pump 182 may maintain the pressure of the inside of the chamber 110 at a level the same as or similar to that of a vacuum state, by drawing out a gas of the inside of the chamber 110 and discharging the same.

In the above case, the deposition material may pass through the first openings 152-1A in the deposition region S, and may be deposited on the display substrate D. Also, the deposition material may pass through a portion of the second openings 152-1B at the edge of the deposition region S, and may be deposited on the display substrate D. In this case, the deposition region S may have a shape excluding, or different from, a rectangle or a square.

Therefore, the mask assembly 150, the apparatus 100 for manufacturing the display device, and a method of manufacturing the display device may be used to deposit a display area having a shape other than a rectangle or a square on the display substrate D.

Hereinafter, the display device manufactured via the mask assembly 150, the apparatus 100 for manufacturing the display device, and the method of manufacturing the display device are described.

Figure 4:
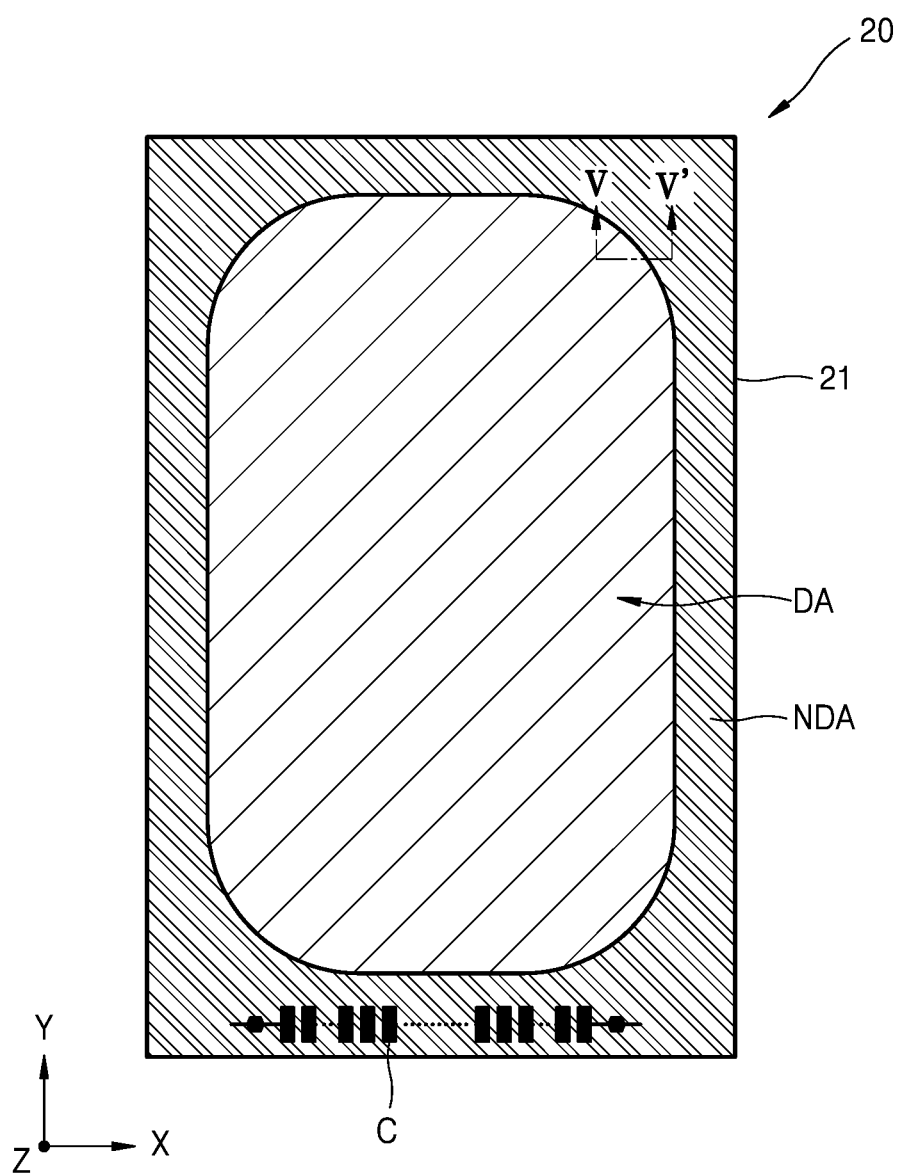
FIG. 4 is a plan view of a display device manufactured by the apparatus illustrated in FIG. 3.
Figure 5:
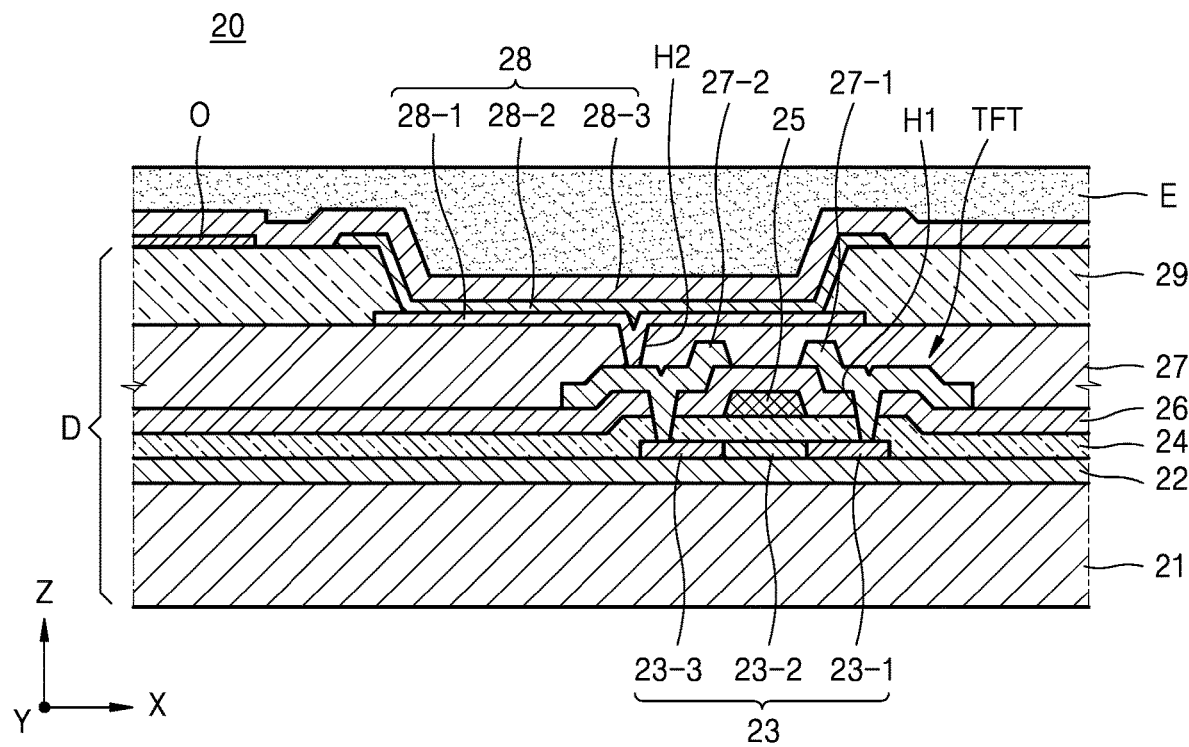
FIG. 5 is a cross-sectional view of the display device of FIG. 4 taken along a line V-V' of FIG. 4.
Figure 6:
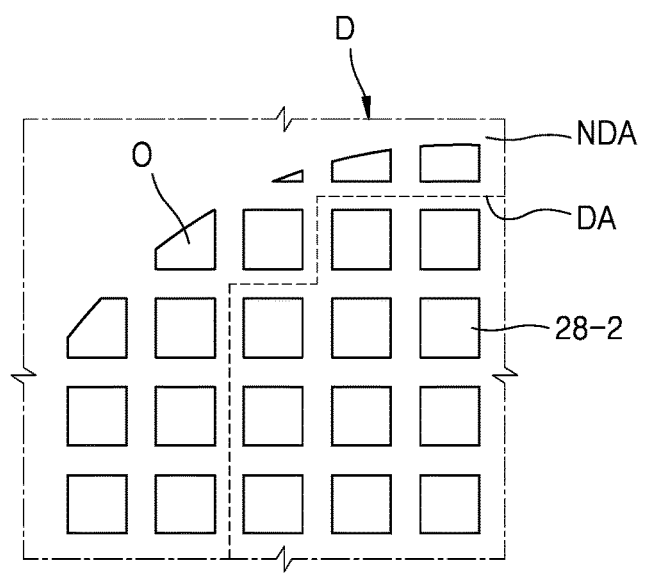
FIG. 6 is a plan view illustrating the arrangement of an intermediate layer and a dummy intermediate layer illustrated in FIG. 5.

FIG. 4 is a plan view of a display device manufactured by the apparatus illustrated in FIG. 3. FIG. 5 is a cross-sectional view of the display device of FIG. 4 taken along a line V-V' of FIG. 4. FIG. 6 is a plan view illustrating the arrangement of an intermediate layer and a dummy intermediate layer illustrated in FIG. 5.

Referring to FIGS. 4 to 6, a display area DA above a substrate 21, and a non-display area NDA around the display area DA, may be defined in the display device 20. An emission portion may be in the display area DA, and a power wiring (not shown), etc. may be in the non-display area NDA. Also, a pad portion C may be in the non-display area NDA.

The display device 20 may include the display substrate D, an intermediate layer 28-2 and a dummy intermediate layer 0 on the display substrate D, as well as an opposite electrode 28-3 on the intermediate layer 28-2 and the dummy intermediate layer 0. Also, the display device 20 may include a thin film encapsulation layer E above the opposite electrode 28-3.

The display substrate D may include the substrate 21, a thin film transistor (TFT), a passivation layer 27, and a pixel electrode 28-1.

The substrate 21 may include a plastic material and may include a metallic material such as steel use stainless (SUS) or Ti. Also, the substrate 21 may include polyimide (PI). Hereinafter, for convenience of description, a case where the substrate 21 includes PI is mainly described.

The TFT may be above the substrate 21, the passivation layer 27 may cover the TFT, and an organic light-emitting diode (OLED) 28 may be above the passivation layer 27.

A buffer layer 22 including an organic compound and/or an inorganic compound is deposited above the substrate 21. The buffer layer 22 may include SiOx (x≥1) and SiNx (x≥1).

After an active layer 23 is formed above the buffer layer 22 in a predetermined pattern, the active layer 23 is covered by a gate insulating layer 24. The active layer 23 may include a source region 23-1 and a drain region 23-3, and may further include a channel region 23-2 therebetween.

The active layer 23 may include various materials. For example, the active layer 23 may include an inorganic semiconductor material such as amorphous silicon or crystalline silicon. As another example, the active layer 23 may include an oxide semiconductor. As another example, the active layer 23 may include an organic semiconductor material. However, hereinafter, for convenience of description, a case where the active layer 23 includes amorphous silicon is mainly described.

The active layer 23 may be formed by forming an amorphous silicon layer above the buffer layer 22, crystallizing the amorphous silicon layer to form a polycrystalline silicon layer, and patterning the polycrystalline silicon layer. The source region 23-1 and the drain region 23-3 of the active layer 23 are doped with impurities depending on a type of the TFT, such as a driving TFT (not shown) or a switching TFT (not shown).

A gate electrode 25 corresponding to the active layer 23, and an interlayer insulating layer 26 covering the gate electrode 25, are formed above the gate insulating layer 24.

Also, contact holes H1 are formed in the interlayer insulating layer 26 and the gate insulating layer 24. Then, a source electrode 27-1 and a drain electrode 27-2 are formed above the interlayer insulating layer 26 such that the source electrode 27-1 and the drain electrode 27-2 respectively contact the source region 23-1 and the drain region 23-3 through the contact holes H1.

The passivation layer 27 is formed above the TFT, and the pixel electrode 28-1 of the OLED 28 is formed above the passivation layer 27. The pixel electrode 28-1 contacts the drain electrode 27-2 of the TFT through a via hole H2 formed in the passivation layer 27. The passivation layer 27 may include a single layer or two or more layers including an inorganic material and/or an organic material. The passivation layer 27 may include a planarization layer having an upper flat surface regardless of bending of a lower layer, or it may be bent in accordance with bending of a layer located therebelow. Also, the passivation layer 27 may include a transparent insulating layer, and thus may have a resonance effect.

After the pixel electrode 28-1 is formed above the passivation layer 27, a pixel-defining layer 29 including an organic material and/or an inorganic material is formed so as to cover the pixel electrode 28-1 and the passivation layer 27. The pixel electrode 28-1 is exposed.

Also, the intermediate layer 28-2 and the opposite electrode 28-3 are formed above at least the pixel electrode 28-1. In another embodiment, the opposite electrode 28-3 may be formed above an entire surface of the display substrate D. In this case, the opposite electrode 28-3 may be formed above the intermediate layer 28-2, the pixel-defining layer 29, and the dummy intermediate layer 0. Hereinafter, for convenience of description, a case where the opposite electrode 28-3 is formed above the intermediate layer 28-2, the pixel-defining layer 29, and the dummy intermediate layer 0 is mainly described.

The pixel electrode 28-1 serves as an anode electrode, and the opposite electrode 28-3 serves as a cathode electrode. The polarities of the pixel electrode 28-1 and the opposite electrode 28-3 may, however, be reversed.

The pixel electrode 28-1 and the opposite electrode 28-3 are insulated from each other by the intermediate layer 28-2, and light is emitted from an organic emission layer by applying voltages of different polarities to the intermediate layer 28-2.

The intermediate layer 28-2 may include the organic emission layer. As an embodiment, the intermediate layer 28-2 may include the organic emission layer and further include at least one of a hole injection layer (HIL), a hole transport layer (HTL), an electron transport layer (ETL), and an electron injection layer (EIL). Embodiments are not limited thereto, however, and the intermediate layer 28-2 may for instance include the organic emission layer and further include various functional layers (not shown).

In this case, the intermediate layer 28-2 may be formed by the above-described apparatus (not shown) for manufacturing the display device.

Also, the dummy intermediate layer 0 may be formed above the pixel-defining layer 29 when forming the intermediate layer 28-2. While the deposition material that has passed through the first openings 152-1A is deposited on the display substrate D and forms the intermediate layer 28-2, the deposition material that has passed through the second openings 152-1B may be deposited on the display substrate D and may form the dummy intermediate layer 0.

In this case, the dummy intermediate layer 0 and the intermediate layer 28-2 may include the same material. Particularly, each of the dummy intermediate layer 0 and the intermediate layer 28-2 may include at least one of an organic emission layer, an HIL, an HTL, an ETL, an EIL, and a function layer.

The intermediate layer 28-2 may be provided as a plurality of intermediate layers 28-2, and the plurality of intermediate layers 28-2 may form a display area DA. Particularly, the plurality of intermediate layers 28-2 may form the display DA in a shape other than a rectangle or a square. In this case, the plurality of intermediate layers 28-2 may be spaced apart from each other inside the display area DA.

The dummy intermediate layer 0 may be provided as a plurality of dummy intermediate layers 0 which may be arranged at the edge (or the boundary) of the display area DA. Particularly, the plurality of dummy intermediate layers 0 may be arranged outside the plurality of intermediate layers 28-2. In this case, the plurality of dummy intermediate layers 0 may be arranged in the non-display area NDA. Therefore, the dummy intermediate layers 0 may not emit light.

At least one of the dummy intermediate layers 0 may have an area different from that of one of the intermediate layers 28-2. Particularly, at least one of the dummy intermediate layers 0 may have an area less than that of the intermediate layer 28-2. The area of at least one of the second openings 152-1B may be less than that of one of the first openings 152-1A due to the first shielding portion 153-2. In this case, a deposition material that has passed through the second opening 152-1B partially shielded by the first shielding portion 153-2 is deposited on an area less than the area of the intermediate layer 28-2, to form a smaller dummy intermediate layer 0.

Meanwhile, one unit pixel includes a plurality of sub-pixels. The plurality of sub-pixels may emit light of various colors. For example, the plurality of sub-pixels may include sub-pixels respectively emitting red, green, and blue light and may include sub-pixels (not shown) respectively emitting red, green, blue, and white light.

The sub-pixel may include one intermediate layer 28-2. In this case, in the case of forming one sub-pixel, the intermediate layer 28-2 and the dummy intermediate layer 0 may be formed by the above-described apparatus 100 for manufacturing the display device.

Meanwhile, the thin film encapsulation layer E may include a plurality of inorganic layers, or an inorganic layer and an organic layer.

The organic layer of the thin film encapsulation layer E includes a polymer and may include a single layer or stacked layers including one of polyethylene terephthalate (PET), PI, polycarbonate (PC), epoxy, polyethylene (PE), and polyacrylate. The organic layer may include polyacrylate. The organic layer may include a polymerized monomer composition including a diacrylate-based monomer and a triacrylate-based monomer. The monomer composition may further include a monoacrylate-based monomer. Also, the monomer composition may further include a well-known photoinitiator such as trimethyl benzoyl diphenyl phosphine oxide (TPO), but embodiments of the inventive concept are not limited thereto.

The inorganic layer of the thin film encapsulation layer E may be a single layer or stacked layers including one of a metallic oxide or a metallic nitride. The inorganic layer may include one of $SiN_x$, $A_2O_3$, $SiO_2$, and $TiO_2$.

An uppermost layer of the thin film encapsulation layer E is exposed, and may thus include an inorganic layer to prevent moisture transmission into the OLED.

The thin film encapsulation layer E may include at least one sandwich structure in which at least one organic layer is inserted between at least two inorganic layers. As another example, the thin film encapsulation layer E may include at least one sandwich structure in which at least one inorganic layer is inserted between at least two organic layers. As a further example, the thin film encapsulation layer E may include at least one sandwich structure in which at least one organic layer is inserted between at least two inorganic layers, and may also include at least one sandwich structure in which at least one inorganic layer is inserted between at least two organic layers.

The thin film encapsulation layer E may include a first inorganic layer, a first organic layer, and a second inorganic layer sequentially arranged over the OLED.

As another example, the thin film encapsulation layer E may include a first inorganic layer, a first organic layer, a second inorganic layer, a second organic layer, and a third inorganic layer sequentially arranged over the OLED.

As another example, the thin film encapsulation layer E may include a first inorganic layer, a first organic layer, a second inorganic layer, a second organic layer, a third inorganic layer, a third organic layer, and a fourth inorganic layer sequentially arranged over the OLED.

In addition, a halogenated metallic layer including LiF may be included between the OLED and the first inorganic layer. The halogenated metallic layer may prevent the OLED from being damaged when the first inorganic layer is sputtered thereon.

The first organic layer may have an area less than that of the second inorganic layer. The second organic layer may have an area less than that of the third inorganic layer.

Therefore, the display device 20 may implement a display area having a shape other than a rectangle or a square.

Figure 7:
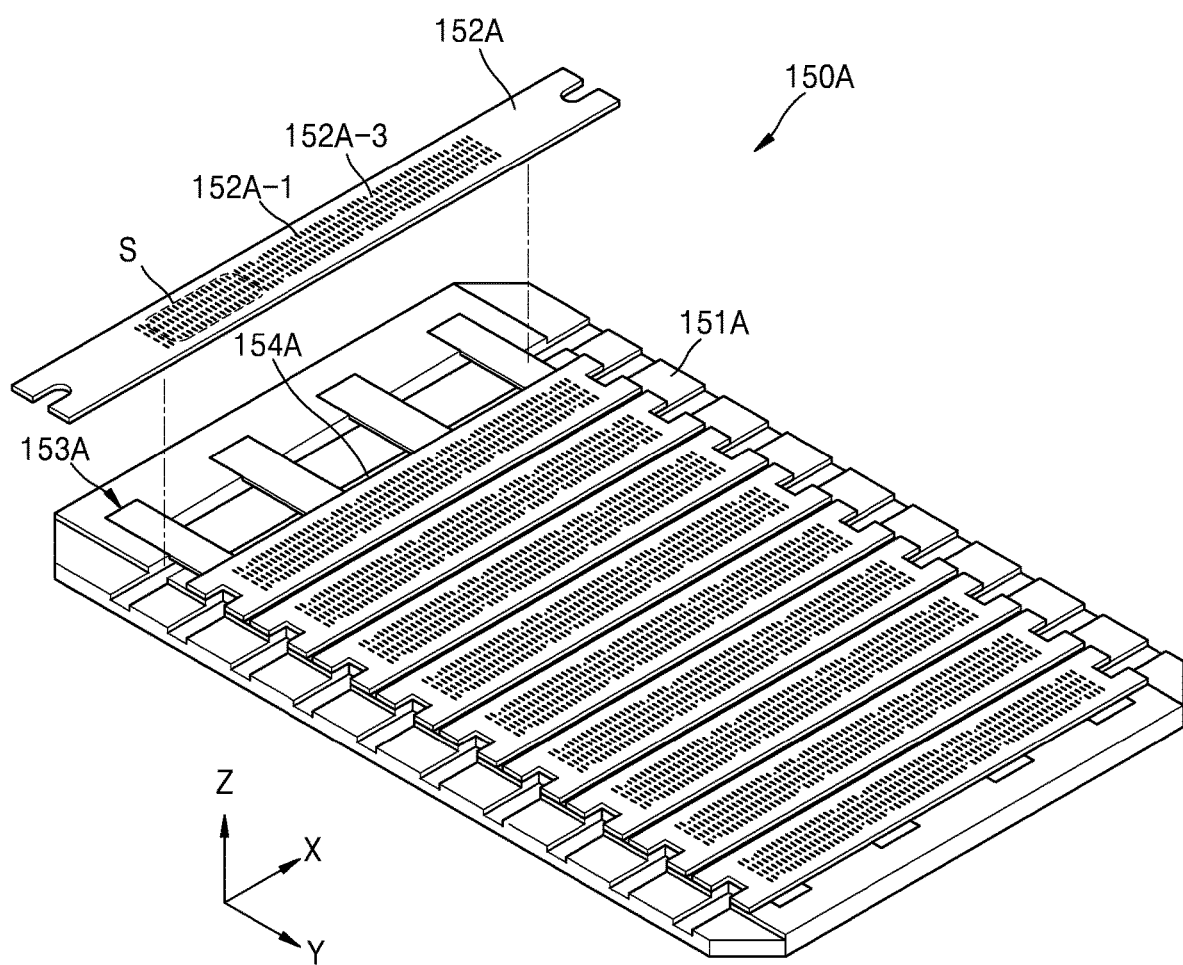
FIG. 7 is a perspective view of a mask assembly according to another embodiment.
Figure 8:
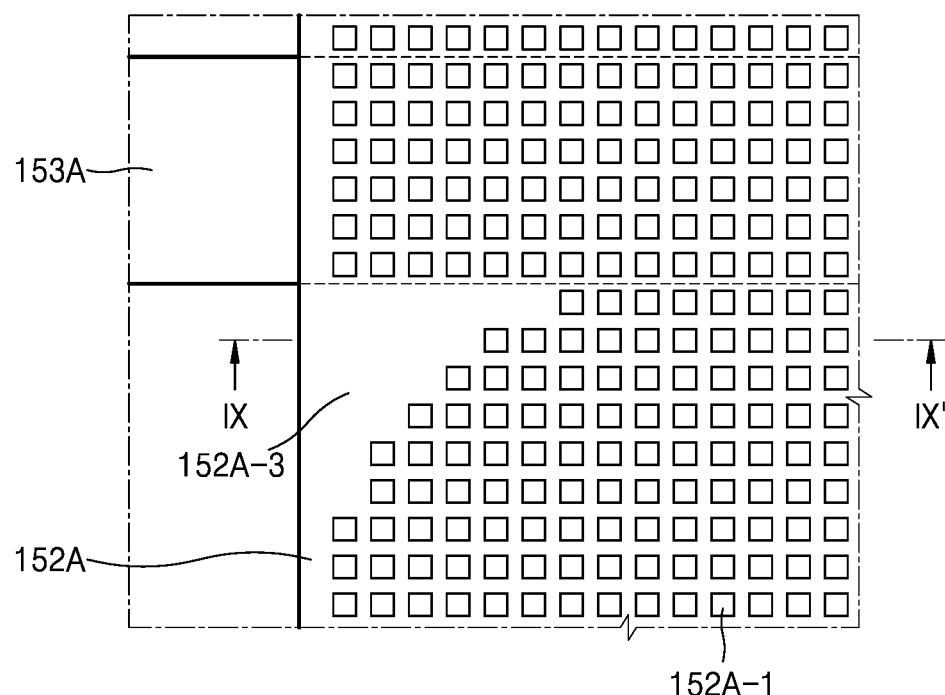
FIG. 8 is a plan view of a mask sheet and a thin shielding plate illustrated in FIG. 7.
Figure 9:
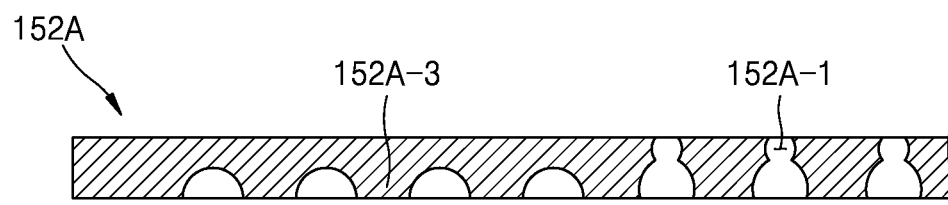
FIG. 9 is a cross-sectional view of the mask sheet of FIG. 8 taken along a line IX-IX'.
Figure 10:
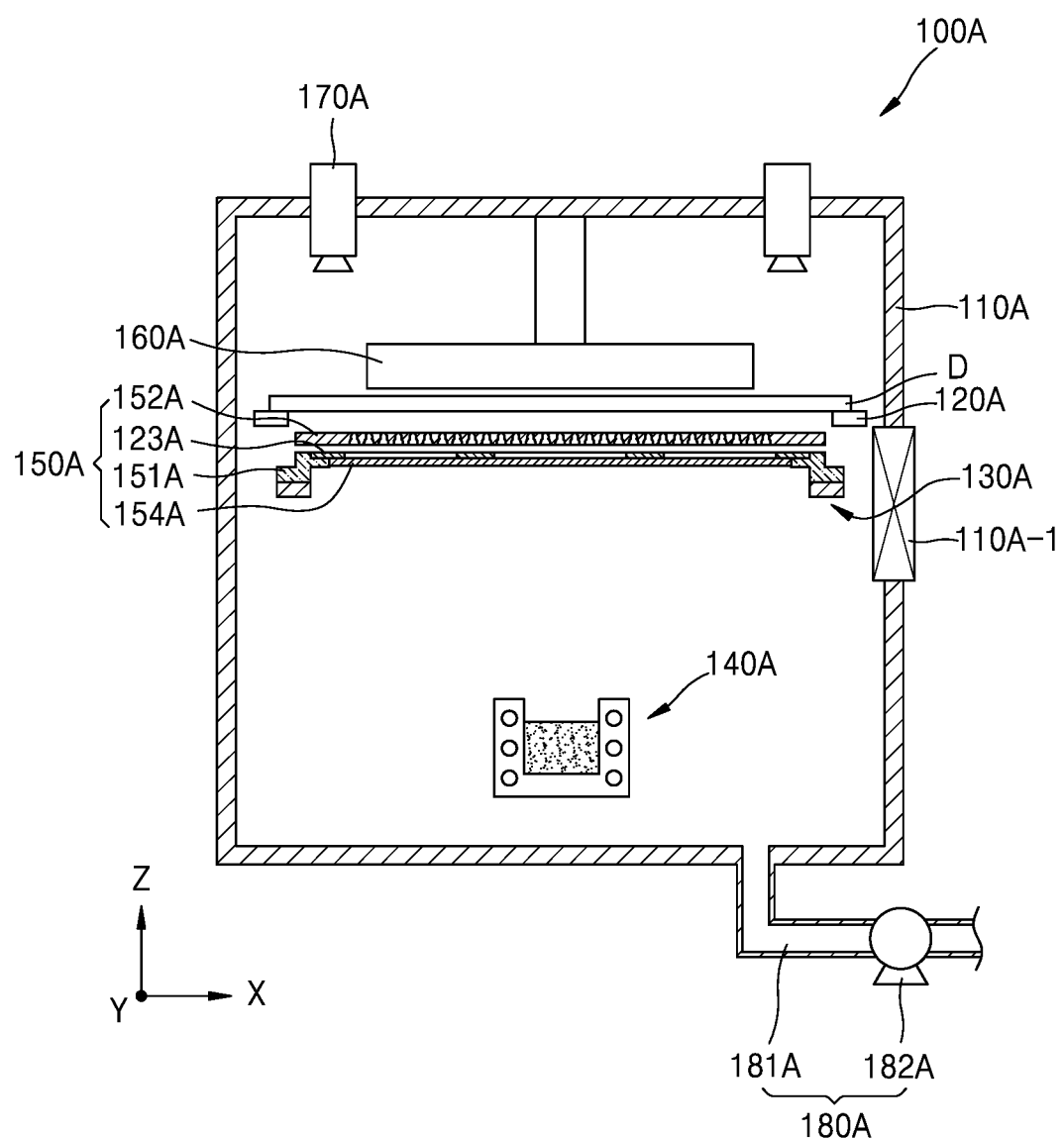
FIG. 10 is a cross-sectional view of an apparatus for manufacturing a display device including the mask assembly illustrated in FIG. 7.
Figure 11:
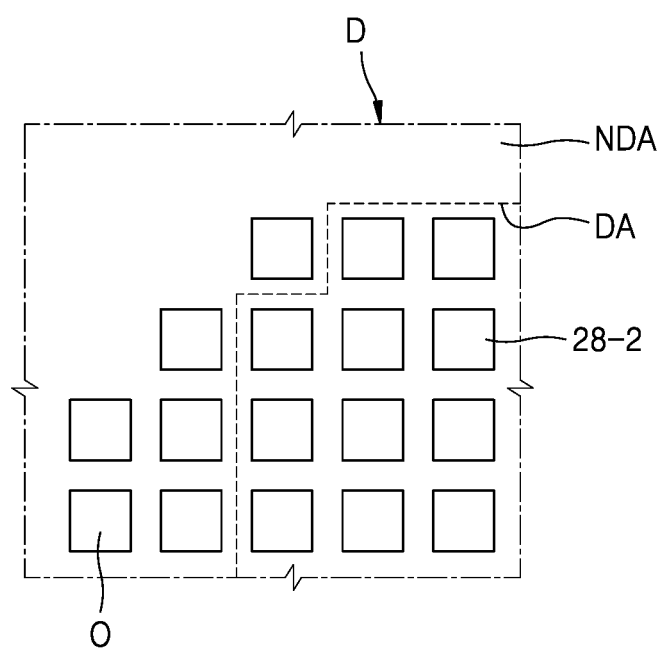
FIG. 11 is a plan view illustrating the arrangement of an intermediate layer and a dummy intermediate layer deposited by the apparatus illustrated in FIG. 10.

FIG. 7 is a perspective view of a mask assembly 150A according to another embodiment. FIG. 8 is a plan view of a mask sheet and a thin shielding plate illustrated in FIG. 7. FIG. 9 is a cross-sectional view of the mask sheet taken along a line IX-IX' of FIG. 8. FIG. 10 is a cross-sectional view of an apparatus 100A for manufacturing a display device including the mask assembly 150A illustrated in FIG. 7. FIG. 11 is a plan view illustrating the arrangement of an intermediate layer and a dummy intermediate layer deposited by the apparatus 100A illustrated in FIG. 10.

Referring to FIGS. 7 to 11, the mask assembly 150A may include a mask frame 151A, a mask sheet 152A, a thin shielding plate 153A, and a support frame 154A. In this case, since the mask frame 151A and the support frame 154A are substantially the same as those described above, descriptions thereof are omitted.

The mask sheet 152A may include a plurality of openings 152A-1. In this case, the plurality of openings 152A-1 may be formed across an entire surface of the mask sheet 152A in a lengthwise direction of the mask sheet 152A.

The mask sheet 152A may include a second shielding portion 152A-3 shielding a portion of the plurality of openings 152A-1. In this case, the second shielding portion 152A-3 may have a thickness different from that of the rest of the mask sheet 152A. For example, the second shielding portion 152A-3 may have a thickness less than that of the mask sheet 152A in which the openings 152A-1 are formed.

A portion of the openings 152A-1 facing the support frame 154A may be formed by etching. The openings 152A-1 may be formed by performing etching twice when needed. In this case, one side of the second shielding portion 152A-3 may be formed after the first etching is made when forming the openings 152A-1. Therefore, the second shielding portion 152A-3 may have a thickness less than that of the rest of mask sheet 152A.

A method of manufacturing the mask sheet 152A is described below. First, a preform for manufacturing the mask sheet 152A may be prepared. After that, an open pattern may be formed in a photoresist by coating the photoresist on the preform and exposing the photoresist. In this case, the photoresist may be arranged over a portion of the preform in which the second shielding portion 152A-3 is to be formed, and may completely shield that portion of the preform.

Also, an etching solution may be sprayed, or a laser may be irradiated onto the preform after the open pattern is formed in the photoresist via exposure. In this case, the etching solution or the laser may reach the preform via the open pattern, and etch one side of the preform.

After that, the photoresist is removed, and a resin may be coated on one side of the etched preform. A photoresist is coated again on a side opposite to the side of the preform on which the resin has been coated, and an open pattern may be formed in the photoresist. In this case, portions of the preform in which the second shielding portion 152A-3 and the openings 152A-1 are to be formed may be exposed.

After that, the openings 152A-1 and the second shielding portions 152A-3 may be formed by removing the photoresist and the resin, and then etching the exposed preform.

The second shielding portion 152A-3 may be provided as a plurality of second shielding portions 152A-3. In this case, the plurality of second shielding portions 152A-3 may be spaced apart from each other. For example, the plurality of second shielding portions 152A-3 may be spaced apart from each other in the width direction of the mask sheet 152A. Also, the plurality of second shielding portions 152A-3 may be spaced apart from each other in the lengthwise direction of the mask sheet 152A. Particularly, from among the plurality of second shielding portions 152A-3, the second shielding portions 152A-3 spaced apart from each other in the lengthwise direction of the mask sheet 152A may define the deposition region S together with the thin shielding plate 153A.

The thin shielding plate 153A may have the form of a plate with a flat shape. In this case, the thin shielding plate 153A may be provided as a plurality of thin shielding plates 153A, and the plurality of thin shielding plates 153A may be spaced apart from each other in the lengthwise direction of the mask sheet 152A.

The deposition region S defined by the thin shielding plate 153A and the second shielding portion 152A-3 may have a shape other than a square or a rectangle.

Meanwhile, the apparatus 100A for manufacturing the display device may include a chamber 110A, a first support 120A, a second support 130A, the mask assembly 150A, a source unit 140A, a magnetic field generating unit 160A, a vision unit 170A, and a pressure adjustor 180A. In this case, since the chamber 110A, the first support 120A, the second support 130A, the source unit 140A, the magnetic field generating unit 160A, the vision unit 170A, and the pressure adjustor 180A are the same as or similar to those described above, descriptions thereof are omitted.

A method of manufacturing a display device is now described. First, the display substrate D is inserted into the chamber 110A and then the mask assembly 150A is arranged to face the display substrate D.

After that, the locations of the mask assembly 150A and the display substrate D are recognized via the vision unit 170A, and then the mask assembly 150A and the display substrate D may be aligned via the second support 130A.

The magnetic field generating unit 160A may apply magnetic force to the mask assembly 150A, thereby coupling the mask sheet 152A to the display substrate D. In this case, the magnetic field generating unit 160A may apply magnetic force to the mask sheet 152A. Particularly, in the case where the boundary portion of the thin shielding plate 153A overlaps the openings 152A-1, magnetic force applied to the mask sheet 152A by the magnetic field generating unit 160A may be weakened or repulsive force may occur at the boundary portion of the thin shielding plate 152A. In this case, the second shielding portion 152A-3 may remove the repulsive force occurring at the boundary portion of the thin shielding plate 153A, by shielding a portion of the plurality of openings 152A-1 at the boundary portion of the thin shielding plate 153A. That is, the magnetic field generating unit 160A may partially cancel the repulsive force occurring at the boundary portion of the thin shielding plate 152A by applying attractive force to the second shielding portion 152A-3.

The source unit 140A may operate and supply the deposition material to the display substrate D. In this case, the deposition material may pass through the openings 152A-1 of the mask sheet 152A and may be deposited on the display substrate D.

The deposition material deposited on the display substrate D may form the dummy intermediate layer 0 and the intermediate layer 28-2. In this case, the dummy intermediate layer 0 and the intermediate layer 28-2 may be provided as a plurality of dummy intermediate layers 0 and a plurality of intermediate layers 28-2, respectively, and the plurality of intermediate layers 28-2 may form the display area DA. Particularly, the display area DA may have a shape other than a square or a rectangle as described above.

At least one of the plurality of dummy intermediate layers 0 may have an area equal to or less than the area of the intermediate layer 28-2. In this case, the plurality of dummy intermediate layers 0 may be arranged outside the plurality of intermediate layers 28-2. Particularly, the plurality of dummy intermediate layers 0 may be arranged in the non-display area NDA and thus may not emit light.

Therefore, the mask assembly 150A, the apparatus 100A for manufacturing the display device, and the method of manufacturing the display device may be used to deposit a shape which is not a rectangle or a square. Also, the mask assembly 150A, the apparatus 100A for manufacturing the display device, and the method of manufacturing the display device may improve deposition efficiency and deposition accuracy by making a more uniform interval between the display substrate D and the mask sheet 152A. The mask assembly 150A, the apparatus 100A for manufacturing the display device, and the method of manufacturing the display device may be used together to minimize deposition defects occurring during deposition.

Figure 12:
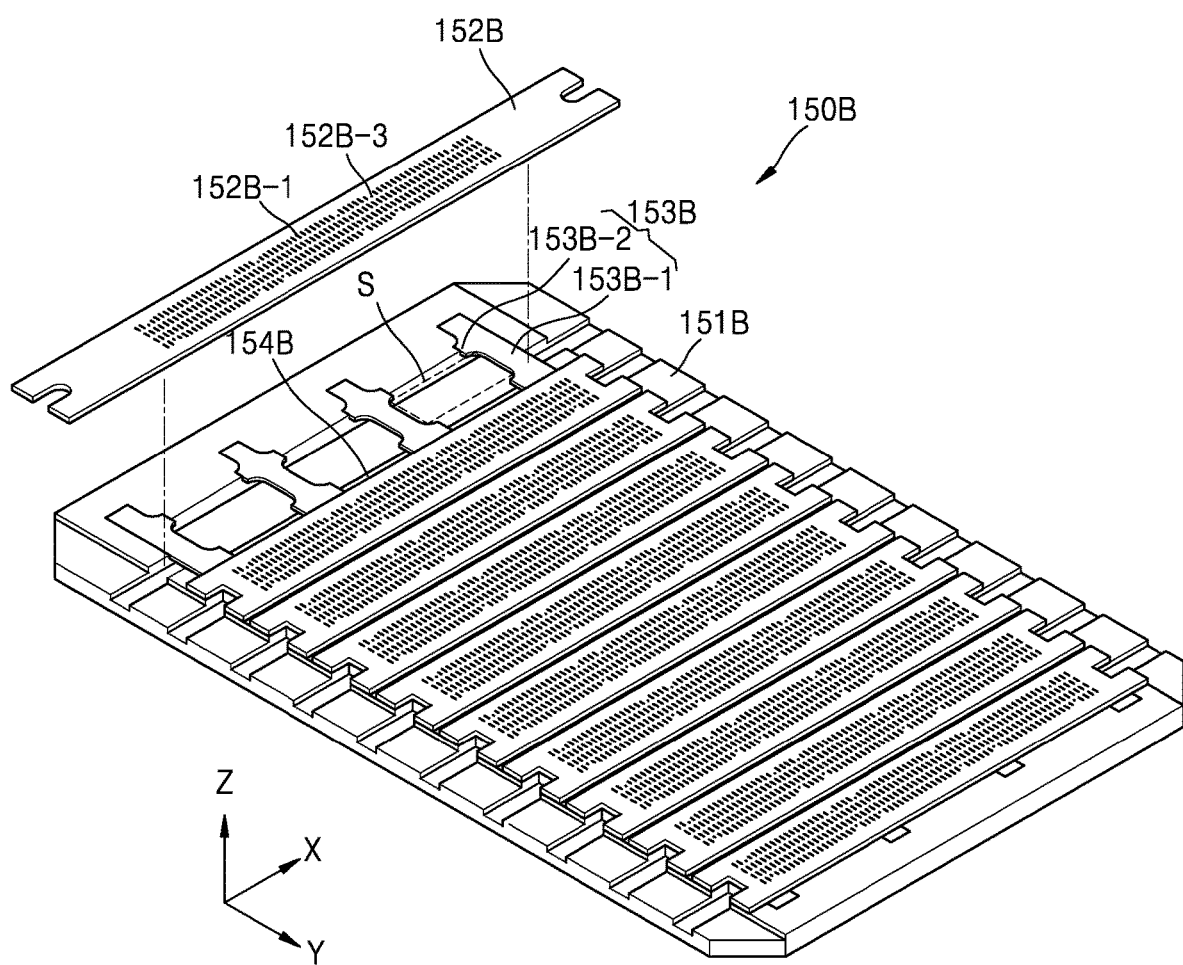
FIG. 12 is a perspective view of a mask assembly according to another embodiment.
Figure 13:
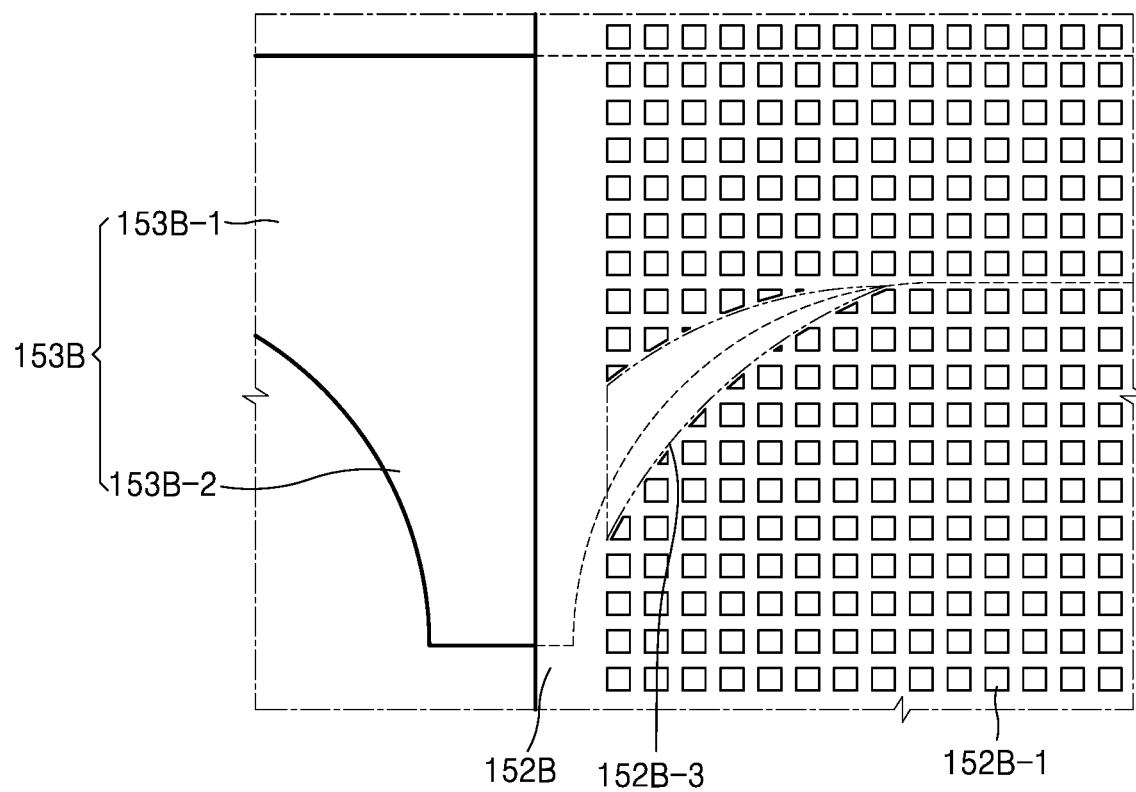
FIG. 13 is a plan view of a mask sheet and a thin shielding plate of the mask assembly illustrated in FIG. 12.
Figure 14:
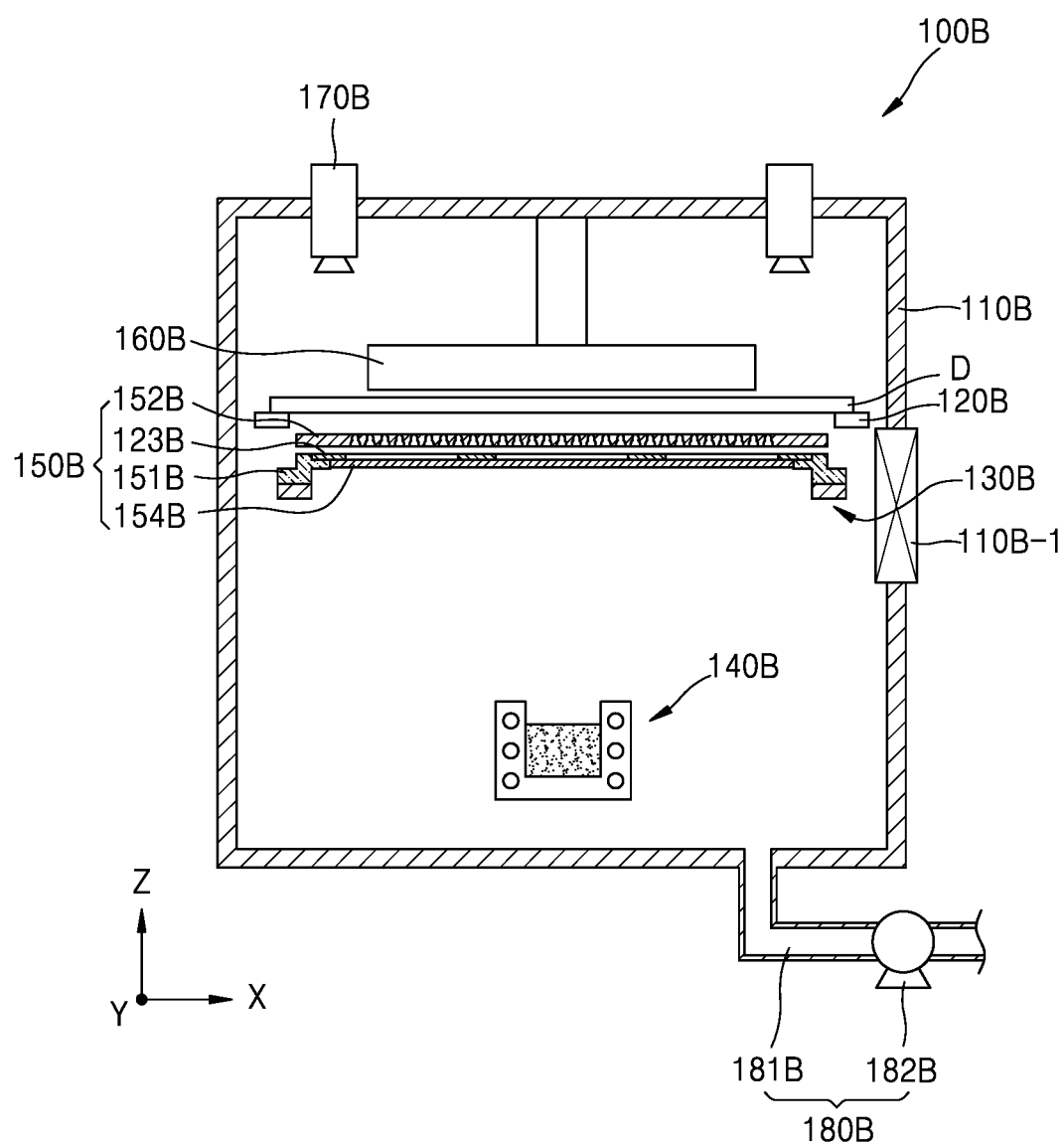
FIG. 14 is a cross-sectional view of an apparatus for manufacturing a display device, the apparatus including the mask assembly illustrated in FIG. 12.
Figure 15:
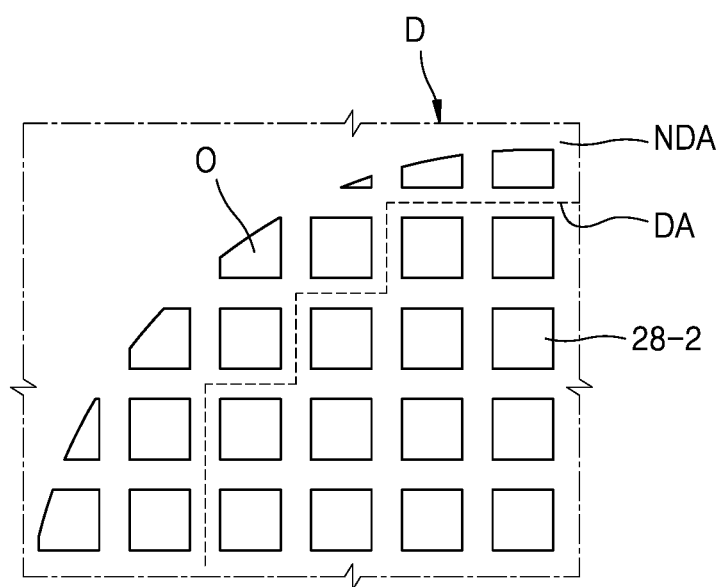
FIG. 15 is a plan view illustrating the arrangement of an intermediate layer and a dummy intermediate layer deposited by the apparatus illustrated in FIG. 14.

FIG. 12 is a perspective view of a mask assembly 150B according to another embodiment. FIG. 13 is a plan view of a mask sheet 152B and a thin shielding plate 153B illustrated in FIG. 12. FIG. 14 is a cross-sectional view of an apparatus for manufacturing a display device, the apparatus including the mask assembly illustrated in FIG. 12. FIG. 15 is a plan view illustrating the arrangement of an intermediate layer and a dummy intermediate layer deposited by the apparatus illustrated in FIG. 14.

Referring to FIGS. 12 to 15, the mask assembly 150B may include a mask frame 151B, the mask sheet 152B, the thin shielding plate 153B, and a support frame 154B. In this case, since the mask frame 151B and the support frame 154B are the same as or similar to those described above, descriptions thereof are omitted.

At least one of the mask sheet 152B and the thin shielding plate 153B may include a shielding portion (not shown) defining a deposition region S. In this case, the shielding portion may include a first shielding portion 153B-2 of the thin shielding plate 153B, and a second shielding portion 152B-3 of the mask sheet 152B.

The mask sheet 152B may include a plurality of openings 152B-1. In this case, the plurality of openings 152B-1 may be spaced apart from each other by a predetermined interval in the lengthwise direction of the mask sheet 152B. Also, the plurality of openings 152B-1 may be formed across the entire surface of the mask sheet 152B in the lengthwise direction of the mask sheet 152B.

The second shielding portion 152B-3 may shield a portion of the plurality of openings 152B-1. In this case, the second shielding portion 152B-3 may shield at least one opening 152B-1 arranged at the boundary of the first shielding portion 153B-2.

The thin shielding plate 153B may be provided as a plurality of thin shielding plates 153B, and the plurality of thin shielding plates 153B may be spaced apart from each other in the lengthwise direction of the mask sheet 152B. Particularly, the plurality of thin shielding plates 153B may define one display area DA with the support frame 1546 arranged between the mask sheets 1526.

The thin shielding plate 153B may include a thin shielding plate body portion 153B-1 formed in a flat shape, and the first shielding portion 153B-2 protruding from the thin shielding plate body portion 153B-1. The first shielding portion 153B-2 may protrude between adjacent thin shielding plates 153B. In this case, the first shielding portions 153B-2 of the adjacent thin shielding plates 1536 may face each other.

At least a portion of the first shielding portion 153B-2 may overlap at least a portion of the second shielding portion 152B-3. The first shielding portion 153B-2 may be arranged at an edge portion of the second shielding portion 152B-3. The edge portion of the first shielding portion 153B-2 may be arranged inside a region of the second shielding portion 152B-3. Particularly, in this case, a portion of the second shielding portion 152B-3 may overlap the first shielding portion 153B-2, and another portion of the second shielding portion 152B-3 may protrude into the deposition area S rather than the first shielding portion 153B-2.

At least a portion of the second shielding portion 152B-3 may have a thickness different from that of the mask sheet 152B. At least a portion of the second shielding portion 152B-3 may have a thickness less than that of the mask sheet 152B. In this case, since a method of forming the thickness of the second shielding portion 152B-3 is the same as or similar to the method described above, a description thereof is omitted.

The apparatus 1006 for manufacturing the display device may include a chamber 1106, a first support 1206, a second support 1306, the mask assembly 1506, a source unit 1406, a magnetic field generating unit 1606, a vision unit 1706, and a pressure adjustor 1806. In this case, since the chamber 1106, the first support 1206, the second support 130B, the source unit 140B, the magnetic field generating unit 160B, the vision unit 170B, and the pressure adjustor 180B are the same as or similar to those described above, descriptions thereof are omitted.

A method of manufacturing a display device is now described. First, the display substrate D is inserted into the chamber 1106 and then the mask assembly 150B may be arranged to face the display substrate D. Also, the mask assembly 150B and the display substrate D may be captured via the vision unit 170B and then the mask assembly 150B and the display substrate D may be aligned.

When alignment of the display substrate D with the mask assembly 150B is completed, the magnetic field generating unit 160B and the source unit 140B may operate. In this case, the magnetic field generating unit 160B may couple the mask assembly 150B to the display substrate D. In this case, magnetic force from the magnetic field generating unit 160B may move the mask sheet 152B toward the display substrate D. In this case, when the boundary of the thin shielding plate 153B overlaps the openings 152B-1, repulsive force may occur at the boundary of the thin shielding plate 153B on the upper surface of the thin shielding plate 153B. In this case, separation at the boundary between the mask sheet 152B and the display substrate D may occur further than at other portions, and the deposition materials that have passed through the openings 152B-1 may be deposited on the display substrate D with a deposition pattern that may not be uniform. However, the magnetic field generating unit 160B may apply attractive force to the first shielding portion 153B-2, thereby solving the problem created by the repulsive force explained above. Particularly, the first shielding portion 153B-2 may allow the deposition materials to be more uniformly deposited on the display substrate D, by preventing the display substrate D and the mask sheet 152B from being floated at the portion of the second shielding portion 152B-3. Also, the first shielding portion 153B-2 may prevent deposition defects from occurring at the display substrate D.

In the case of depositing the deposition material on the display substrate D as described above, the dummy intermediate layer 0 and the intermediate layer 28-2 may be formed on the display substrate D. In this case, the dummy intermediate layer 0 and the intermediate layer 28-2 may respectively be provided as a plurality of dummy intermediate layers 0 and a plurality of intermediate layers 28-2, spaced apart from each other.

At least one of the plurality of dummy intermediate layers 0 may have an area less than that of one of the plurality of intermediate layers 28-2. Particularly, the dummy intermediate layer 0 deposited via the openings 152B-1 arranged at the boundary of at least one of the first shielding portion 153B-2 and the second shielding portion 152B-3 may have an area less than the area of the intermediate layer 28-2.

When the plurality of intermediate layers 28-2 and the dummy intermediate layers 0 are formed as described above, the plurality of intermediate layers 28-2 may form the display area DA. In this case, the plurality of dummy intermediate layers 0 may be arranged in the non-display area NDA, which is outside the display area DA. Also, the display area DA may have a shape other than a square or a rectangle.

Therefore, the mask assembly 150B, the apparatus 1008 for manufacturing the display device, and the method of manufacturing the display device may be used to deposit a shape which is not a rectangle or a square. Also, the mask assembly 150B, the apparatus 1008 for manufacturing the display device, and the method of manufacturing the display device may improve deposition efficiency and deposition accuracy by making a more uniform interval between the display substrate D and the mask sheet 152B. The mask assembly 150B, the apparatus 1008 for manufacturing the display device, and the method of manufacturing the display device may be used to minimize deposition defects occurring during deposition.

Though the inventive concept has been described with reference to the embodiments illustrated in the drawings, this is merely for illustrative purposes and it will be understood by those of ordinary skill in the art that various changes in form and details and equivalents thereof may be made therein without departing from the spirit and scope of the inventive concept as defined by the following claims. Various features of the above described and other embodiments can be mixed and matched in any manner, to produce further embodiments consistent with the invention.

What is claimed is:

1. A method of manufacturing a display device, the method comprising:
    arranging a mask assembly such that the mask assembly faces a display substrate;
    applying a force to the mask assembly to direct the mask assembly toward the display substrate by using a magnetic field generator; and
    emitting a deposition material from a source unit so that the deposition material passes through the mask assembly and is on the display substrate,
    wherein the mask assembly comprises:
    a mask frame;
    at least two mask sheets installed on the mask frame, each of the mask sheets comprising a plurality of openings; and
    at least two thin shielding plates disposed between the mask frame and the at least two mask sheets such that the at least two thin shielding plates are spaced apart from each other and each completely shields at least one of the plurality of openings of each mask sheet in a plan view, and
    wherein one of the mask sheets and the thin shielding plates comprises a shielding portion, the shielding portion selectively blocking at least portions of the openings so as to form a deposition region having a shape other than a rectangle or a square.

2. The method of claim 1, wherein the shielding portion comprises a first shielding portion including a portion of the thin shielding plate and protruding to the deposition region.

3. The method of claim 1, wherein the shielding portion comprises a second shielding portion shielding a portion of the plurality of openings in the deposition region, the mask sheet comprising the second shielding portion.

4. The method of claim 3, wherein at least a portion of the second shielding portion has a thickness less than that of the mask sheet.

5. The method of claim 1, wherein the shielding portion comprises:
    a first shielding portion including a portion of the thin shielding plate and protruding to the deposition region; and
    a second shielding portion shielding a portion of the plurality of openings in the deposition region, the mask sheet comprising the second shielding portion.

6. The method of claim 5, wherein the first shielding portion at least partially overlaps the second shielding portion.

7. The method of claim 1, wherein the depositing the deposition material further comprises depositing the deposition material on the display substrate in a vacuum.

8. The method of claim 1, wherein the shielding portion shields at least a portion of at least one opening at a boundary of the deposition region.

9. The method of claim 1, wherein the depositing the deposition material further comprises depositing the deposition material on a non-emission region of the display substrate.

10. The method of claim 1, wherein the mask sheet comprises a material different from that of the thin shielding plate.

11. A method of manufacturing a display device, the method comprising:
    arranging a mask assembly such that the mask assembly faces a display substrate;
    applying a force to the mask assembly to direct the mask assembly toward the display substrate by using a magnetic field generator; and
    forming a plurality of dummy intermediate layers in a non-display area on a pixel-defining layer not to cover an opening formed in the pixel-defining layer and a plurality of intermediate layers in a display area while emitting a deposition material from a source and allowing the deposition material to pass through the mask assembly,
    wherein the display area comprises a shape other than a rectangle or a square, and
    wherein at least one of the plurality of dummy intermediate layers and one of the plurality of intermediate layers has the same area in a plan view.

12. The method of claim 11, wherein one of the plurality of intermediate layers has an area different from that of one of the plurality of dummy intermediate layers.

13. The method of claim 12, wherein the one of the plurality of dummy intermediate layers has an area less than that of the one of the plurality of intermediate layers.

14. The method of claim 11, wherein the plurality of intermediate layers and the plurality of dummy intermediate layers comprise the same material.

15. The method of claim 11, wherein the plurality dummy intermediate layers are arranged in a non-emission region.

* * * * *